US012794450B2

(12) United States Patent
Schoenwald et al.

(10) Patent No.: US 12,794,450 B2
(45) Date of Patent: Nov. 10, 2026

(54) CLOCK DISTRIBUTION GATING

(71) Applicant: Advanced Micro Devices, Inc., Santa Clara, CA (US)

(72) Inventors: Matthew Schoenwald, Fort Collins, CO (US); Russell Schreiber, Austin, TX (US); Carl Dietz, Fort Collins, CO (US); Ryan J. Miller, Fort Collins, CO (US); Richard Martin Born, Fort Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 29 days.

(21) Appl. No.: 19/089,975

(22) Filed: Mar. 25, 2025

(65) Prior Publication Data

US 2026/0303066 A1 Oct. 1, 2026

(51) Int. Cl.
*G06F 1/00* (2006.01)
*G06F 1/10* (2006.01)
*H03K 3/011* (2006.01)

(52) U.S. Cl.
CPC ............... *H03K 3/011* (2013.01); *G06F 1/10* (2013.01)

(58) Field of Classification Search
CPC .... H03K 5/15; G06F 1/04; G06F 1/06; G06F 1/10; G06F 1/12; G06F 1/32; G06F 1/3237; G06F 2117/04
See application file for complete search history.

(56) References Cited

U.S. PATENT DOCUMENTS

| | | | | |
|---|---|---|---|---|
| 8,466,739 | B2 * | 6/2013 | Kim | H03L 7/00 257/691 |
| 8,525,569 | B2 * | 9/2013 | Bucelot | G06F 1/10 257/777 |
| 10,063,241 | B2 * | 8/2018 | Ma | G11C 29/023 |
| 12,381,183 | B2 * | 8/2025 | Koyanagi | G06F 3/0688 |
| 2022/0343045 | A1 * | 10/2022 | Herberholz | G06F 1/10 |

* cited by examiner

*Primary Examiner* — Tuan T Lam
(74) *Attorney, Agent, or Firm* — Greenberg Traurig, LLP

(57) ABSTRACT

The disclosed device includes a base die and one or more stack die, and includes various components that facilitate power management for the device. The device, for example, includes a clock driver that drives a clock signal for propagation through a clock distribution tree for delivery to one or more components of the one or more stack die. A controller of the device triggers an operation on the one or more stack die and generates a stack die activity prediction based on the triggered operation. A clock gater of the device gates the clock signal for at least a portion of the clock distribution tree based on the stack die activity prediction. Various other methods, systems, and computer-readable media are also disclosed.

20 Claims, 6 Drawing Sheets

CLOCK DISTRIBUTION GATING

BACKGROUND

As demand for semiconductor devices that provide high-processing capability continues to increase, the use of multi-die semiconductor packages to satisfy such demands has also increased. Such multi-die semiconductor packages can include a base die and any number of stack die that can be stacked vertically on top of the base die within the semiconductor package. The base die typically serves as the primary die of the package that contains the core functions of the device in which the multi-die semiconductor package is installed. The stack die that are stacked on top of the base die often provide additional processing, storage, or other capabilities to complement, supplement, or provide redundancy for the functionality supported by the base die. Power management techniques can be utilized to avoid localized heat generation, provide thermal management within the semiconductor package, increase power consumption efficiency, among other benefits.

BRIEF DESCRIPTION OF THE DRAWINGS

The accompanying drawings illustrate a number of exemplary implementations and are a part of the specification. Together with the following description, these drawings demonstrate and explain various principles of the present disclosure.

Figure 1:
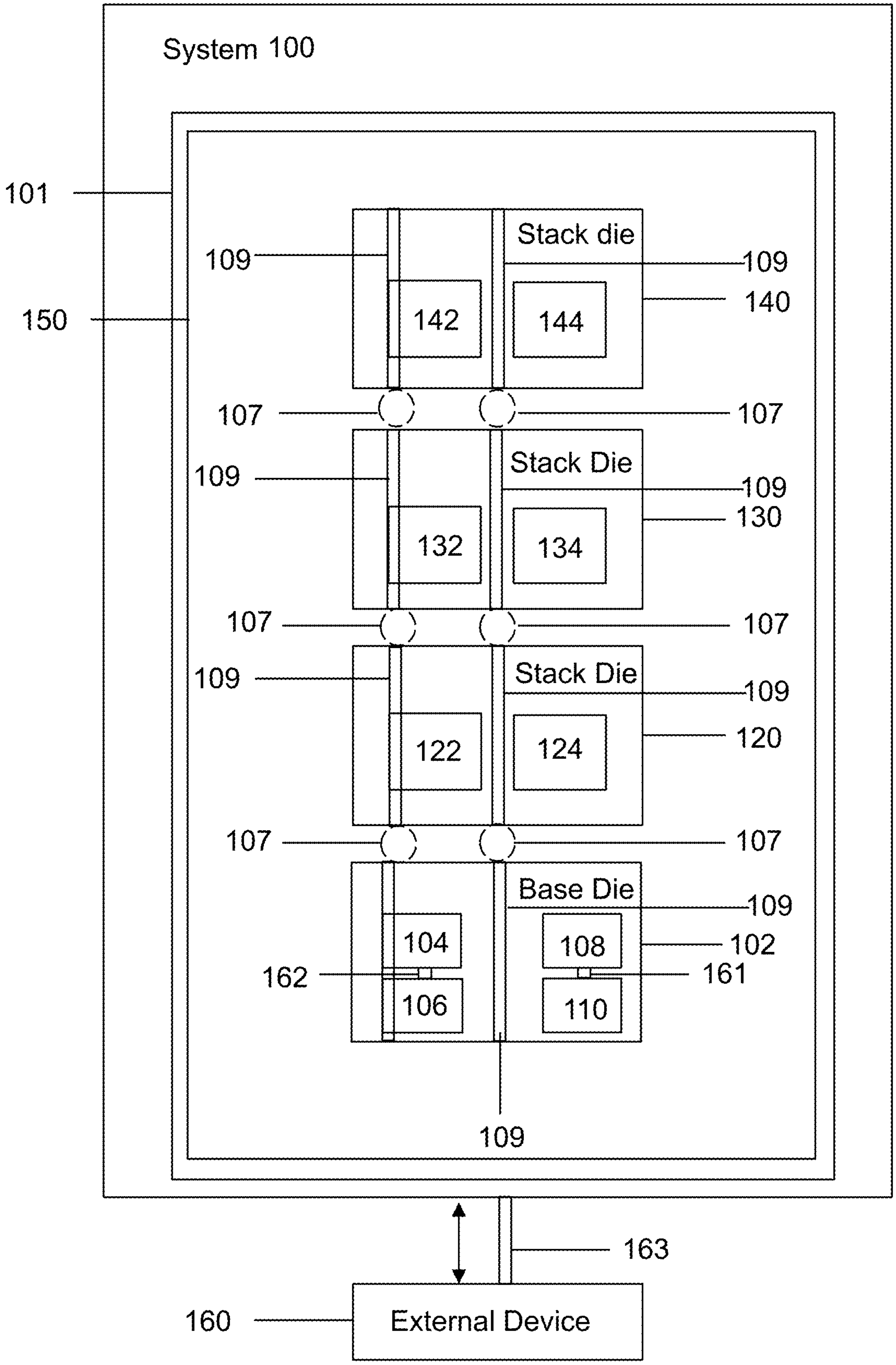
FIG. 1 is a schematic diagram of an exemplary system for providing clock distribution gating according to implementations of the present disclosure.

Throughout the drawings, identical reference characters and descriptions indicate similar, but not necessarily identical, elements. While the exemplary implementations described herein are susceptible to various modifications and alternative forms, specific implementations have been shown by way of example in the drawings and will be described in detail herein. However, the exemplary implementations described herein are not intended to be limited to the particular forms disclosed. Rather, the present disclosure covers all modifications, equivalents, and alternatives falling within the scope of the appended claims.

DETAILED DESCRIPTION

The present disclosure is generally directed to providing clock distribution gating, such as base die and stack die of a semiconductor package of a device or system. As the use of computing devices to perform various types of operations continues to increase, the performance, stability, reliability, and health of the die of a semiconductor device are of concern. Additionally, the effective use of resources, such as power, by the base die and stack die is also of concern. For example, if the stack die of the semiconductor package are not performing operations and are idle, propagating clock signals through various components of the stack die can consume power unnecessarily and lead to increased costs of operation over time. Implementations of the present disclosure facilitate prediction and detection of states, conditions and/or other factors associated with the stack die that can be utilized by the systems and methods of the present disclosure to determine when to conduct clock distribution gating through various portions of a clock distribution tree. As will be explained in greater detail below, implementations of the present disclosure can perform clock distribution gating by utilizing a controller of a semiconductor device to predict stack die activity for one or more stack die of a semiconductor device, such as by triggering operations and analyzing execution of the operations. Based on the stack die activity prediction, the system and methods can determine whether certain portions of the clock distribution tree that propagates the clock signal to the various stack die of the semiconductor device need to be gated. In the event that the stack die activity predictions indicate that certain portions of the clock distribution tree need to be gated, the systems and methods can generate control signals to cause the clock gate circuits (e.g., circuits/circuitry for gating or otherwise removing a clock signal, also referred to as clock gaters herein) to gate (i.e., prevent) the clock signal from propagating through such portions of the clock distribution tree, at least for a period of time. By effectively gating the clock signal based on predicted stack die activity, the system and methods reduce power consumption, enhance component life, more effectively utilize computing resources, and provide a variety of other benefits as discussed in the present disclosure.

In certain implementations, a device, such as a semiconductor device, for providing clock distribution gating is provided. The device can include one or more stack die disposed in a vertical stack and a first die (e.g., a base die) of the one or more stack die. In certain implementations, the first die can include a clock driver that can drive a clock signal through clock distribution tree of the semiconductor device for delivery to one or more components of the one or more stack die. In certain implementations the first die can include a controller that can trigger a first operation on the one or more stack die. The controller can generate a stack die activity prediction based on the first operation triggered on the one or more stack die. In certain implementations, the first die can include a clock gater that can gate the clock signal through at least a portion of the clock distribution tree based on the stack die activity prediction.

In certain implementations, the first die can include a clock generator that can generate the clock signal and provide the clock signal to the clock driver to drive the clock signal through the clock distribution tree for delivery to the one or more components of the one or more stack die. In certain implementations, the clock gater can gate the clock signal through at least the portion of the clock distribution tree based on sensor data from one or more sensors of the device. In certain implementations, the controller can generate the stack die activity prediction based on a type of the first operation triggered on the one or more stack die.

In certain implementations, the controller can trigger a second operation on the one or more stack die. In certain implementations, the controller can generate a second stack die activity prediction based on the second operation triggered on the one or more stack die. In certain implementations, the controller can gate the clock signal through the clock distribution tree in accordance with the second stack die activity prediction. In certain implementations, the controller can gate the clock signal through at least a portion of the clock distribution tree based on the stack die activity prediction providing an indication that the one or more components will be in an idle state. In certain implementations, the controller can gate the clock signal through at least the portion of the clock distribution tree based on a performance associated with the one or more stack die, the one or more components, the first die, or a combination thereof.

In certain implementations, the controller can generate a control signal to re-enable or ungate the clock signal through at least the portion of the clock distribution tree, and provide the control signal to the clock gater. In certain implementations, the controller can ungate or re-enable, based on the control signal, the clock signal through at least the portion of the clock distribution tree. In certain implementations, the controller can generate, based on the stack die activity prediction, a performance of the device, sensor data, or a combination thereof, a control signal to gate the clock signal through at least the portion of the clock distribution tree, and the controller can provide the control signal to the clock gater.

In certain implementations, the clock gater can gate, based on the control signal, the clock signal through at least the portion of the clock distribution tree. In certain implementations, the controller can receive an instruction from an external device to perform a second operation. In certain implementations, the controller can determine that the second operation has a correlation with the stack die activity prediction. In certain implementations, the controller can generate a control signal to gate the clock signal through at least the portion of the clock distribution tree, and can provide the control signal to the clock gater to gate the clock signal.

In certain implementations, a system for providing clock gating distribution can be provided. In certain implementations, the system can include a memory, and a device communicatively linked to the memory. In certain implementations, the device can include one or more stack die and a base die, which can be disposed in a vertical stack with the one or more stack die. In certain implementations, the base die of the device can include a clock driver that can drive a clock signal through a clock distribution tree for delivery to one or more components of the one or more stack die. In certain implementations, the base die includes a controller that triggers based on instructions from the memory, a first operation on the one or more stack die. In certain implementations, the controller can generate, based on the instructions from the memory, a stack die activity prediction based on the first operation triggered on the at least one stack die. In certain implementations, the base die can include a clock gate that can gate the clock signal through at least a portion of the clock distribution tree based on the stack die activity prediction.

In certain implementations, the controller is further configured to identify a component of the one or more components for which the clock signal is to be gated by the clock gater. In certain implementations, the one or more stack die further comprises a stack die clock driver that can drive a stack die clock signal through a stack die clock distribution tree for delivery to the one or more components of the one or more stack die. In certain implementations, the one or more stack die can include a stack die controller that can trigger, based on instructions from the memory, a second operation on the one or more stack die. In certain implementations, the stack die controller can generate, based on the instructions from the memory, a different stack die activity prediction based on the second operation triggered on the one or more stack die. In certain implementations, the one or more stack die can include a stack die clock gater that can gate the stack die clock signal through the stack die clock distribution tree based on the different stack die activity prediction.

In certain implementations, a method for providing clock distribution gating is provided. In certain implementations, the method can include driving, by utilizing a clock driver, a clock signal through a clock distribution tree for delivery to one or more components of the one or more stack die. In certain implementation, the method can include triggering, by utilizing a controller of a semiconductor device comprising a stack, such as a vertical stack, including a base die and the one or more stack die, a first operation on the one or more stack die. In certain implementations, the method can include generating, by utilizing the controller, a stack die activity prediction based on the first operation triggered on the one or more stack die. For example, the stack die activity prediction can be based on the type of the first operation. In certain implementations, the method can include gating, by utilizing a clock gater, the clock signal through at least a portion of the clock distribution tree based on the stack die activity prediction. In certain implementations, the method can include ungating the clock signal based on a control signal generated by the controller, based on the stack die activity prediction, or a combination thereof.

Features from any of the implementations described herein can be used in combination with one another in accordance with the general principles described herein. These and other implementations, features, and advantages will be more fully understood upon reading the following detailed description in conjunction with the accompanying drawings and claims.

The following will provide, with reference to FIGS. 1-6, detailed descriptions of providing clock distributing gating, such as for a semiconductor device including a base die and one or more stack die stacked on the base die. Detailed descriptions of example systems will be provided in connection with FIGS. 1, 2, 3, 4, and 5. Detailed descriptions of corresponding methods will also be provided in connection with FIG. 6. Any of the components, functionality, features, and/or other aspects of the systems and methods of FIGS. 1, 2, 3, 4, 5, and 6 can be combined together to form various implementations of the present disclosure.

FIG. 1 is a schematic block diagram of an exemplary system 100 for providing clock distribution gating according to implementations of the present disclosure. In certain implementations, the system 100 can correspond to any number of devices, communication links, programs, components, printed circuit boards, and/or any other systems and devices. In certain implementations, the system 100 can include any combination of devices, communication links, programs, components, printed circuit boards, and/or any other combinations of systems and devices. Computing device 101 can correspond to a computing device, such as a desktop computer, a laptop computer, a server, a tablet device, a mobile device, a smartphone, a wearable device, an augmented reality device, a virtual reality device, a network device, an electronic device, and/or other device. In certain implementations, the computing device 101 can include any number of processors, memories, communication devices, printed circuit boards, and/or other components. The computing device 101 can be configured to perform operations, such as, but not limited to, obtain data, process data, store data, transmit data, modify data, perform any action with respect to data, or a combination thereof.

In certain implementations, the computing device 101 can include a semiconductor package 150. In certain implementations, the semiconductor package 150 can include an enclosure that houses a base die 102 and any number of stack die 120, 130, 140 that can be stacked onto the base die 102. The stack die 120, 130, 140, for example, can be stacked vertically on top of the base die 102 within the semiconductor package 150, however, other configurations for stacking can also be utilized. In certain implementations, the base die 102 can be connected to stack die 120 via a bump 107 (e.g., microbumps made of solder material) and/or other component (e.g., metal connection) that is used to connect bond pads on the surface of the base die 102 to the corresponding bond pad on the stack die 120. A bump 107 or other component (e.g., metal connection) can be utilized to create electrical connections between the bond pads of dies adjacent to each other in the stack of the semiconductor package 150. Similarly, the stack die 120 can be connected to stack die 130 via a bump 107 and/or other component that that is used to connect bond pads on the surface of the stack die 120 to the corresponding bond pad on the stack die 130. As a further example, the stack die 130 can be connected to stack die 140 via a bump 107 and/or other component that is used to connect bond pads on the surface of the stack die 130 to the corresponding bond pad on the stack die 140. In certain implementations, any number of microbumps 107 can exist between each pair of die within the stack. In certain implementations, a microbump 107 can be positioned in between a pair of die, such as, but not limited to, wherever a through silicon-via 109 begins or ends.

In certain implementations, each of the base die 102, the stack die 120, the stack die 130, and/or the stack die 140 can include interconnects that pass through the corresponding die so as to provide a direct electrical path between each layer in the stack of the semiconductor package 150. In certain implementations, the interconnects, for example, can be through-silicon vias (e.g., through-silicon vias 109) that extend an entire height of each of the base die 102, the stack die 120, the stack die 130, and/or the stack die 140. In certain implementations, there can be any number of through-silicon vias 109 extending through the base die 102, the stack die 120, the stack die 130, and/or the stack die 140. In certain implementations, the base die 102 and the stack die 120, 130, 140 can be connected to each other directly using through-silicon vias 109 without using the microbumps 107. The through-silicon vias 109 can include conductive material, such as, but not limited to, copper that can be utilized to connect a bond pad on one die to a bond pad on another die within the stack. Through-silicon vias 109 can be utilized to enable rapid communication between each of the die layers in the semiconductor stack 150 and can be utilized to facilitate transmission of signals, such as signals including data, sensor measurements, commands, instructions and/or any other type of information that can be carried via signals. In certain implementations, the through-silicon vias 109 can be utilized for implementations including 3D integrated circuits.

In certain implementations, the base die 102 can be the primary component of the semiconductor package 150 that can be utilized to control the operation of the semiconductor package 150 and communicate with external devices, such as external device 160. In certain implementations, the base die 102 can communicate with any of the components of the computing device 101, receive instructions from other components of the computing device 101 (e.g., to process data, store data, retrieve data, transmit data, etc.), provide results to other components of the computing device 101, or a combination thereof. Additionally, the base die 102 can interact with each of the stack die 120, 130, 140, such as by transmitting instructions to the stack die 120, 130, 140 (e.g., to store data, process data, retrieve data, etc.). In certain implementations, the base die 102 can activate or deactivate any of the stack die 120, 130, 140. In certain implementations, the base die 102 can obtain information associated with the current performance and/or operational states of the stack die 120, 130, 140.

In certain implementations, the base die 102 can be made of silicon and can include any number of transistors, diodes, integrated circuits, and/or other components. For example, the base die 102 can include any number and/or combination of integrated circuits, such as, but not limited to, processors (e.g., microprocessors, core complexes (CCXs), etc.), memories, microcontrollers, sensors, digital signal processors, voltage regulators, communication devices (e.g., wireless), operational amplifiers, field-programmable gate arrays, and/or any other types of integrated circuits. Illustratively, the base die 102 of FIG. 1 can include a controller 104 (e.g., which can include control circuitry, processor capabilities and/or be a processor), a memory 106, a communication device 108, a sensor 110, and/or any other components. In certain implementations, the base die 102 can include any number of controllers 104, memories 106, communication devices 108 (generally representing any bus (e.g., buses 161, 162, 163, 212), circuitry, connections, interfaces, and/or any other communicative pathways for sending communicative signals based on one or more communication protocols, between components/devices described herein), sensors 110, and/or any other components. In certain implementations, the controller 104 can execute instructions to perform various operations (e.g., store data, process data, retrieve data, communicate with stack die 120, 130 140, etc.). In certain implementations, the controller 104 can be a stack die controller if on a stack die 120, 130, 140 or a base die controller if on the base die 102. The controller 104 can also be utilized to deactivate and activate sensors (e.g., sensor 110), obtain signals containing sensor data from the sensors (e.g., sensor 110), monitor the sensors, initiate actions to be performed based on sensor data, maintain an operational state of the base die 102 and/or stack die 120, 130, 140, adjust an operational state of the base die 102, and/or stack die 120, 130, 140, and/or perform any other operations. In certain implementations, the controller 104 can include chiplets (e.g., smaller and in some examples more specialized processing units that can coordinate as a single chip), microprocessors, microcontrollers, Central Processing Units (CPUs), graphics processing units (GPUs), Field-Programmable Gate Arrays (FPGAs) that implement softcore processors, Application-Specific Integrated Circuits (ASICs), systems on chip (SoCs), digital signal processors (DSPs), Neural Network Engines (NNEs), accelerators, graphics processing units (GPUs), portions of one or more of the same, variations or combinations of one or more of the same, and/or any other suitable physical processor.

In certain implementations, the memory 106 can store data and instructions that can be retrieved and/or accessed by the controller 104. The memory 106 can represent any type or form of volatile or non-volatile storage device capable of storing data and/or computer-readable instructions. For example, the memory 106 can be flash memory, cache memory, any type of memory, or a combination thereof. In certain implementations, the communication device 108 can communicate with external devices (e.g., external device 160) and/or other components of the system 100. The memory 106 can store clock signaling information, stack die activity predictions, sensor data (e.g., sensor data that can be utilized to generate the stack die activity predictions), threshold information for thresholds utilized for comparison purposes to sensor data, information associated with actions to be performed with regard to the semiconductor package 150, and/or any other information. In certain implementations, the communication device 108 can communicate wirelessly to other devices and can be any type of communication device. In certain implementations, the sensor 110 can be any type of sensor including, but not limited to, temperature sensors (e.g., thermistor, thermocouples, infrared sensors, integrated temperature sensors, digital thermal sensors, etc.), motion sensors, light sensors, pressure sensors, humidity sensors, accelerometers, orientation sensors (e.g., gyroscope), vibration sensors, any other type of sensors or a combination thereof. Sensors 110 located on and/or in proximity to the base die 102 can be base die sensors. In certain implementations, any number of sensors 110 can be included in the base die 102 and/or on any location of the base die 102.

In certain implementations, for example, the sensors 110 can measure and/or generate sensor data proximate to the location at which the sensors 110 are positioned. The sensor data from the sensors 110 can be provided to the controller 104 of the base die 102, such as via signals from the sensors 110. In certain implementations, the sensors 110 can be activated by the controller 104, deactivated by the controller 104, accessed by the controller 104, communicate with the controller 104, or a combination thereof. In certain implementations, the sensors 110 can communicate with any of the components of the system 100.

In certain implementations, the stack die 120, 130, 140 can be secondary components of the system 100. Much like the base die 102, the stack die 120, 130, 140 can be made of silicon and can include any number of transistors, diodes, integrated circuits, and/or other components. For example, the stack die 120, 130, 140 can include any number and/or combination of integrated circuits, such as, but not limited to, processors (e.g., microprocessors), memories, microcontrollers, sensors, digital signal processors, voltage regulators, communication devices (e.g., wireless), operational amplifiers, field-programmable gate arrays, and/or any other types of integrated circuits. Illustratively, as shown in FIG. 1, the stack die 120 can include components 122 and sensors 124, stack die 130 can include components 132 and sensors 134, and stack die 140 can include components 142 and sensors 144. In certain implementations, the components 122, 132, 142 can be processors, memories, integrated circuits, and the like. In certain implementations, any number of stack die 120, 130, 140 can be utilized with the semiconductor package 150. In certain implementations, the sensors 124, 134, 144 can be placed at any locations on the respective stack dies 120, 130, 140, such as at locations that are expected to be associated with certain types of operations, certain amounts of operations, locations where component are susceptible for failure, potential hotspot locations, any other locations, or a combination thereof. Sensors 124, 134, 144 located on and/or in proximity to stack die 120, 130, 140 can be stack die sensors. In certain implementations, the sensors 124, 134, 144 can be any type of sensors, such as the sensors described in the present disclosure.

Figure 2:
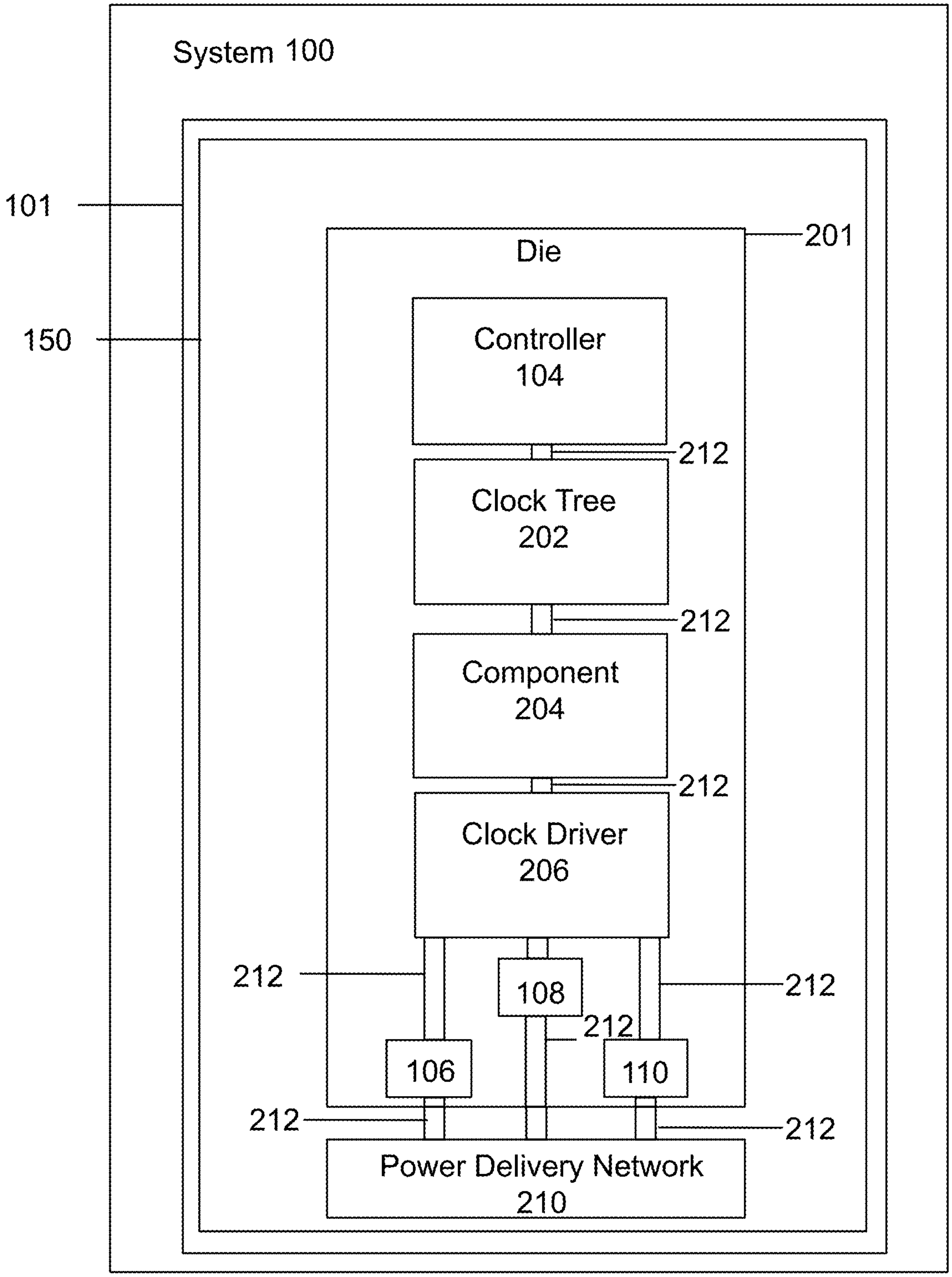
FIG. 2 is a schematic diagram of an exemplary die featuring components for use with systems according to implementations of the present disclosure.

Referring now also to FIG. 2, a schematic diagram of an exemplary architecture for clock distributing gating including additional components for one or more die (e.g., base die and/or stack die) of the semiconductor package 150 of the system 100 according to implementations of the present disclosure is shown. In certain implementations, the components of FIG. 2 can be utilized with the system 100, the semiconductor package 150, the computing device 101, and/or any of the other systems, components, and/or devices shown in FIGS. 1-6. In certain implementations, in addition to including the components shown in FIG. 1, the computing device 101 containing the semiconductor package 105 can also include any of the components illustrated in FIG. 2. For example, in FIG. 2, the semiconductor package 150 of the computing device 101 is illustratively shown as including die 201, the controller 104, a clock tree 202 (e.g., clock distribution tree), component(s) 204, clock driver 206, a memory 106 (e.g., cache or other type of memory), a communication device 108, a sensor 110, a power delivery network 210, and/or any other components, such as shown in FIG. 1. In certain implementations, the controller 104, the memory 106, the communication device 108, and/or the sensor 110, can include any of the features and/or functionality as described for the system 100 of FIG. 1.

In certain implementations, the controller 104 can include circuitry and/or instructions for controlling and/or managing at least some aspects of power management and/or a power delivery network 210, such as power gater circuits that can selectively provide or block power delivery. In certain implementations, controller 104 can also be configured to power on and off clock driver 206. In certain implementations, clock tree 202 can correspond to a circuit (including wiring) for providing a clock signal to various components (e.g., component 204 and other components of system 100). In certain implementations, the clock signal distributed through the clock tree 202 can be utilizing to providing timing control (e.g., timing reference for circuits) so that components (e.g., flip-flops, registers, etc.) have a timing reference for performing operations, synchronization so that components can perform operations in a synchronized manner, timing information for data propagation through the system 100, timing information for conducting sequential operations, clock frequency information to indicate how fast the system 100 and components are to operate, among other capabilities. In certain implementations, component(s) 204 can correspond to one or more components coupled to the clock tree 202. In certain implementations, for example, the component(s) can correspond to logic components, data components, flip-flops, memories, processors, communication devices, etc., and/or portions thereof.

In certain implementations, clock driver 206 can include a driver circuit (e.g., circuits that provide sufficient output current to drive a signal over a distance) for amplifying or otherwise propagating a signal, such as the clock signal of clock tree 202, through the branches of the clock tree 202 and to the various components in the path. In certain implementations, the clock signal to be distributed through the clock tree 202 can be generated by a clock generator, such as clock generator 302. In certain implementations, the power delivery network 210 can include circuitry and components for delivering power to the various components of the system 100 and/or semiconductor package 150. In certain implementations, the power delivery network 210 can include power gaters that can be coupled to the components

204 and/or other components of the computing device 101, and can be utilized to deliver power or prevent power from being delivered to various components of the computing device 101. In certain implementations, the power delivery network 210 can be controlled by the controller 104 and can control which power gaters are provided with power to deliver power to the various components connected to the power gaters.

Figure 3:
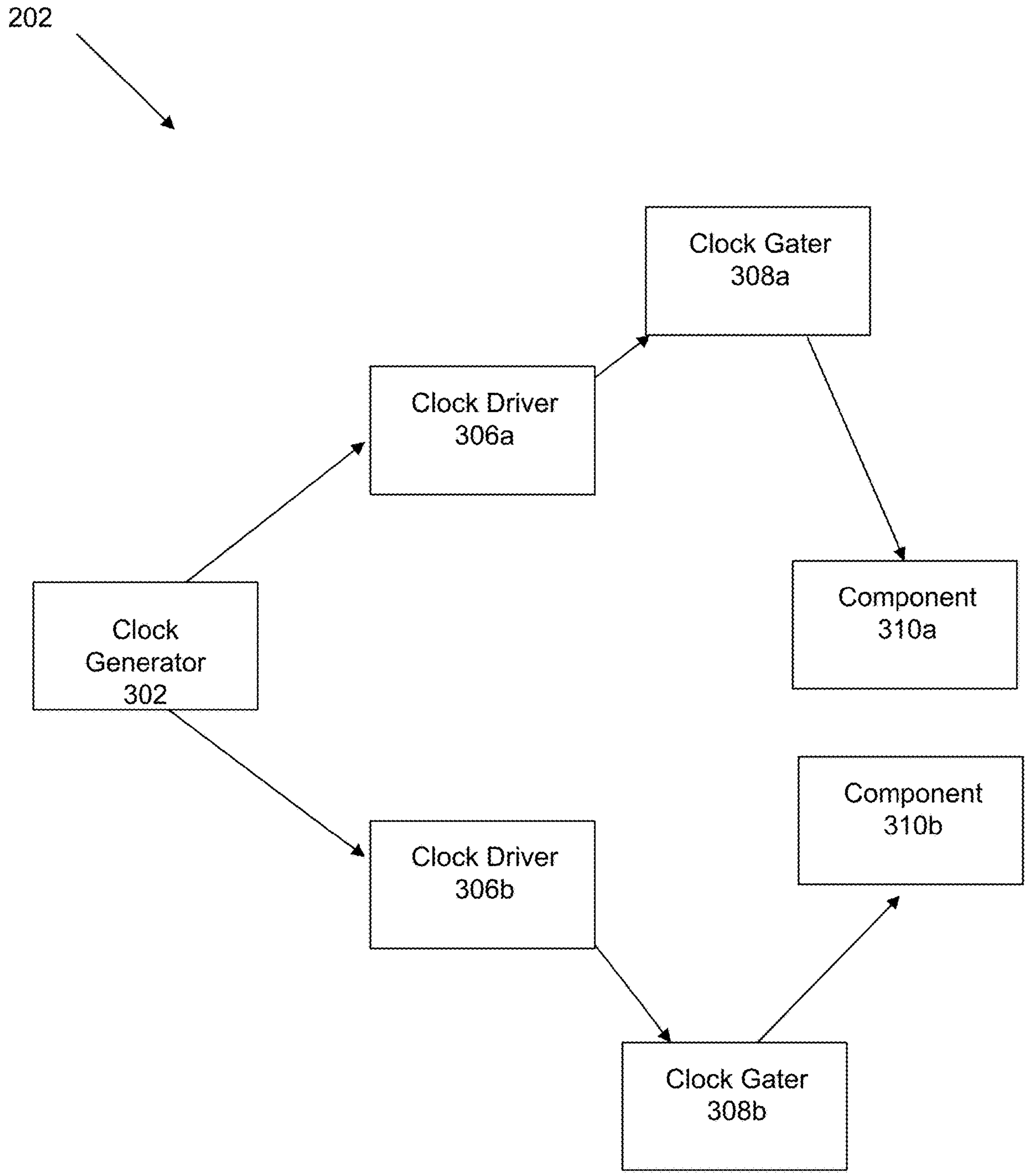
FIG. 3 is a schematic diagram of a clock distribution tree featuring a clock generator, clock drivers, and clock gaters for gating clock signals to various components according to implementations of the present disclosure.

Referring now also to FIG. 3, an exemplary clock distribution tree 202 featuring exemplary components of a computing device 101 are schematically illustrated. In certain implementations, the clock distribution tree 202 can be a network of components connected to each other through wiring and/or interconnects (e.g., through silicon vias 109), which can be utilized to route a clock signal from a clock source (e.g., clock generator 302) to the various components of the computing device 101, such as, but not limited to, memories, processors, flip-flips, registers, sequential logic components, communication devices, any other components, or a combination thereof. In certain implementations, the clock distribution tree can be utilized to ensure that the clock signal is provided to all components in the tree/network in a synchronized and/or timely manner, while also minimizing clock jitter, skew, or other potential issues, such as those than can cause errors or delays.

In certain implementations, the clock tree 202 can include a clock generator 302, clock drivers 306*a*, 306*b*, clock gaters 308*a*, 308*b*, and components 310*a*, 310*b*. In certain implementations, the clock generator 302 can be an electronic circuit that can produces a periodic clock signal that can be utilized to synchronize the operations of components of the computing device 101. For example, the clock signal can be a square wave or other wave of a selected frequency that can provide a timing reference for circuits and/or components, such as flip-flops, registers, counters, etc. to ensure that such components operate in a synchronized and/or coordinated fashion. The clock signal can be utilized to define timing for memory operations, data processing, control operations, and/or other operations that can be conducted by the computing device 101. In certain implementations, the clock generator 302 can be a crystal oscillator, RC oscillator, phase-locked loop (PLL) clock generator, clock synthesizer, direct digital synthesis clock generator, other type of clock generator, or a combination thereof. In certain implementations, the clock drivers 306*a*, 306*b* (e.g., base die clock driver if implemented on base die and stack die clock driver if implemented on stack die) can be electronic circuits that can be utilized to distribute and/or buffer the clock signal generated by the clock generator 302 to the various components connected to the clock tree 202. In certain implementations, the clock drivers 306*a*, 306*b* (e.g., stack die clock driver if implemented on stack die or base die clock driver if implemented on base die) can amplify the clock signal (e.g., base die clock signal) generated by the clock generator 302 before delivery to the components 310*a*, 310*b* (which can be the same or similar as components 122, 132, 142, 204). In certain implementations, the clock drivers 306*a*, 306*b* can also be utilized to reduce clock skew and jitter and can be any type of clock driver including, but not limited to, buffer drivers, clock tree drivers, low-skew drivers, differential clock drivers, low-power clock drivers, and/or other types of clock drivers.

In certain implementations, the clock gaters 308*a*, 308*b* can be logic gates (e.g., AND gates, OR gates, or other type of gates) or other components that control whether a clock signal is passed through to a particular component or not. For example, the clock gaters 308*a*, 308*b* can be utilized to block the clock signal from going to a particular component, such as if the component is expected to be idle or is currently idle (e.g., not being used for an operation). By block the clock signal from certain parts of the computing device 101, power consumption and wear and tear of the components can be reduced. In certain implementations, such as in an AND gate implementation, the clock signal can serve as the first input to the AND gate and the other input to the AND gate can be a clock enable signal (e.g., control signal) that can be provided by a controller, such as controller 104. When the clock enable signal is active (i.e., logic 1), the clock gaters 308*a*, 308*b* can allow the clock signal to pass through the AND gate and to the flip-flops and/or other components of the computing device 101, thereby turning the components on and/or activating them. If the clock enable signal is inactive (i.e., logic 0), the clock signal can be blocked from passing through the AND gate and the flip-flops and/or other components beyond the AND gate do not receive the clock signal and are thereby turned off. In certain implementations of the present disclosure, the clock enable signal can be provided based on a stack die activity prediction generated by the system 100, which is discussed in further detail below.

Figure 4:
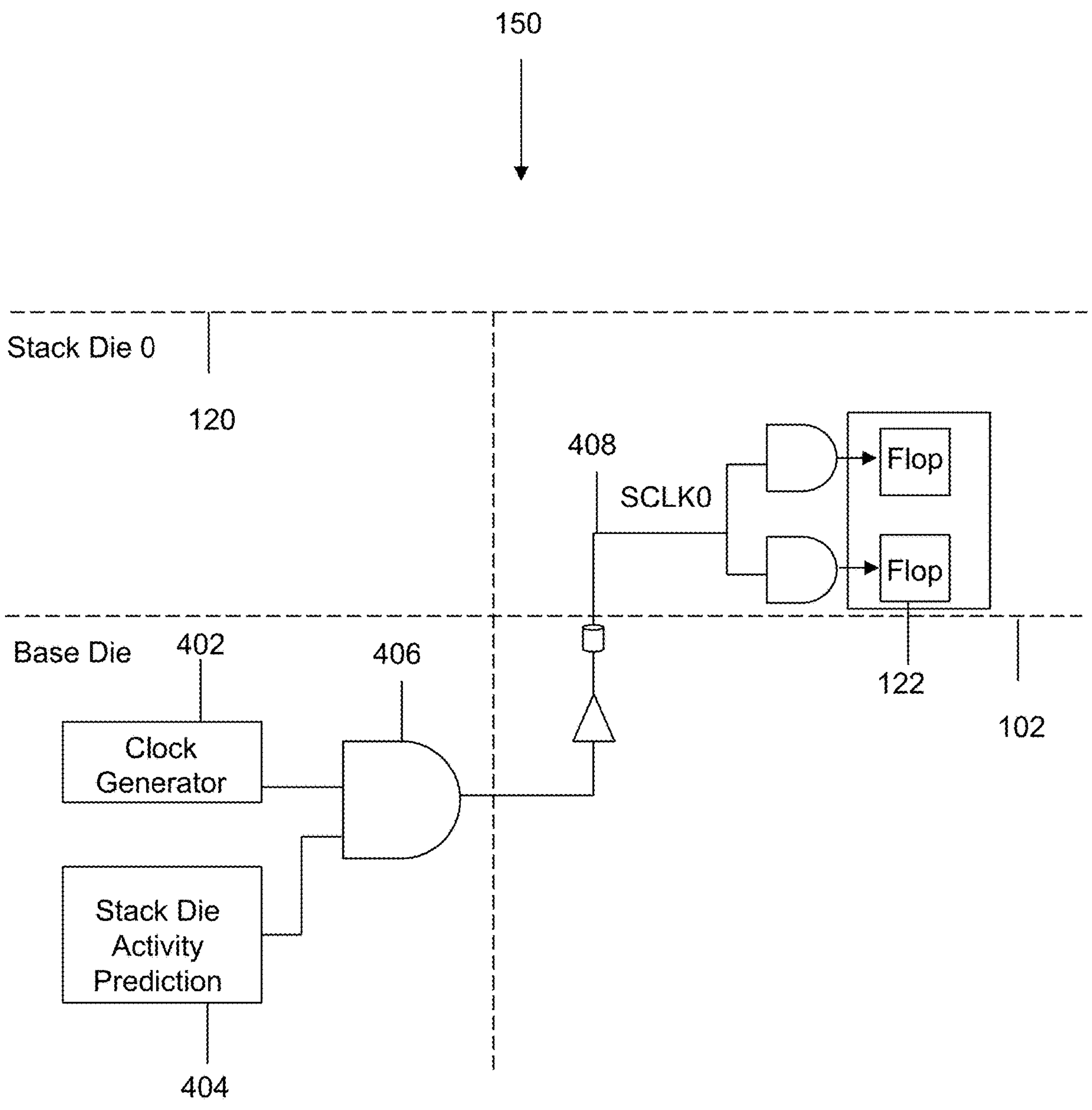
FIG. 4 is a schematic diagram of an exemplary architecture for components on a base die of a semiconductor device for gating a clock distribution tree according to implementations of the present disclosure.

Referring now also to FIG. 4, an exemplary architecture for clock distribution gating components on a base die of a semiconductor package 150 of a semiconductor device for gating a clock distribution tree is provided. In FIG. 4, the semiconductor package 150 can include a base die 102, components 122 (e.g., stack die components, such as flip-flops, registers, etc.), a stack die 120, a clock generator 402, a stack die activity prediction line 404, an AND gate/clock gater 406 (or OR gate depending on the type of implementation), a select clock line 408, a controller (e.g., base die controller) any other components, or a combination thereof. In certain implementations, the components of FIG. 4 can be same as the components of the other figures of the present disclosure. In certain implementations, the clock generator 402 can generate the clock signal and can serve as the first input to the AND gate 406. The controller 104 and/or other components of the computing device 101 can generate a stack die activity prediction (discussed in further detail in the present disclosure) that indicates whether a particular stack die should receive a clock signal or not. For example, if the stack die activity prediction indicates that the stack die 120 will be idle at a particular time, the stack die activity prediction line 404 can be provided with a clock disable signal (e.g., logic 0), which can cause the AND gate 406 to prevent the clock signal from passing to the components of stack die 120. If, however, the stack die activity prediction indicates that the stack die 120 is to be operative and not idle (or low power) at a particular time (e.g., to perform an operation), the stack die activity prediction line 404 can be provided with a clock enable signal (e.g., logic 1), which can cause the AND gate to pass the clock signal through the AND gate 406 and to the select clock line 0 408 so that the clock signal is provided to the components 122 in the clock tree 202 so that the components are synchronized and/or powered on. In certain implementations, the clock disable or enable signal resulting from the stack die activity prediction can be provided as a control signal from the controller 104, for example.

Figure 5:
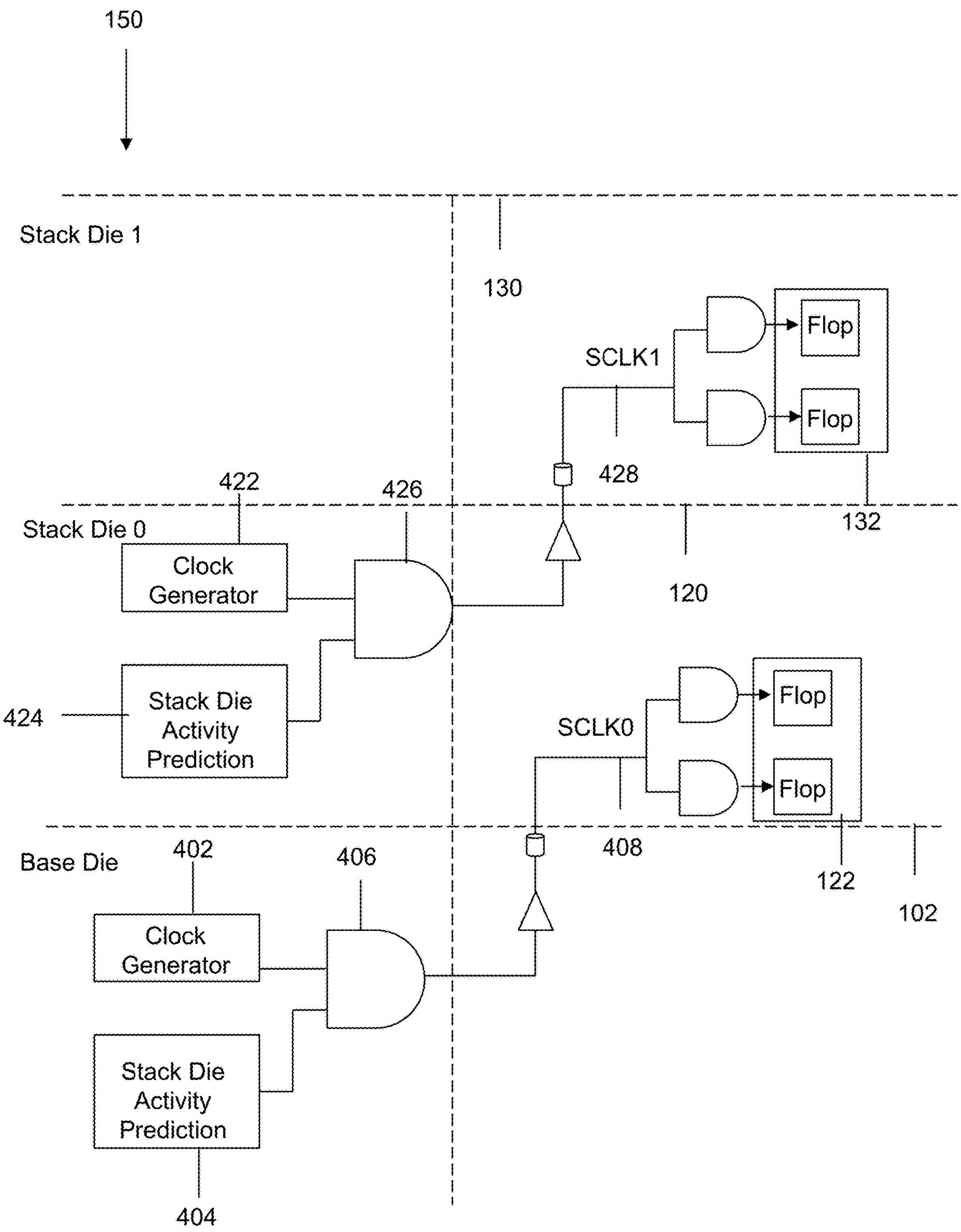
FIG. 5 is a schematic diagram of another exemplary architecture for components on a base die and/or stack die of a semiconductor device for gating a clock distribution tree according to implementations of the present disclosure.

Referring now also to FIG. 5, an exemplary architecture for clock distribution gating components on a base die and/or stack die of a semiconductor package 150 of a semiconductor device for gating a clock distribution tree is provided. In certain implementations, in FIG. 5, the semiconductor package 150 can include a base die 102, components 122 (e.g., stack die components, such as flip-flops, registers, etc.), a stack die 120, a clock generator 402, a stack die activity prediction line 404, an AND gate/clock gater 406 (or OR gate depending on the type of implementation), a select clock line 408, a stack die 130, a clock generator 422 (e.g., creates stack die clock signals), a stack die activity prediction line 424, an AND gate 426 (e.g., clock gater), a select clock line 428, components 132, a controller 104 (e.g., stack die controller) any other components, or a combination thereof. In certain implementations, the clock generator 402 can generate the clock signal and can serve as the first input to the AND gate 406. The controller 104 and/or other components of the computing device 101 can generate a stack die activity prediction (discussed in further detail in the present disclosure) that indicates whether a particular stack die should receive a clock signal or not. For example, if the stack die activity prediction indicates that the stack die 120 will be idle at a particular time, the stack die activity prediction line 404 can be provided with a clock disable signal (e.g., logic 0), which can cause the AND gate 406 to prevent the clock signal from passing to the components of stack die 120. If, however, the stack die activity prediction indicates that the stack die 120 is to be operative and not idle (or low power) at a particular time (e.g., to perform an operation), the stack die activity prediction line 404 can be provided with a clock enable signal (e.g., logic 1), which can cause the AND gate to pass the clock signal through the AND gate 406 and to the select clock line 0 408 of the clock distribution tree 202 (e.g., base die clock distribution tree or base die tree) so that the clock signal is provided to the components 122 in the clock tree 202 so that the components are synchronized and/or powered on. In certain implementations, the clock disable or enable signal resulting from the stack die activity prediction can be provided as a control signal from the controller 104, for example.

In certain implementations, the clock generator 422, which can be implemented on the stack die 120 can generate a clock signal and can serve as the first input to the AND gate 426. In certain implementations, the stack die 120 can also include a controller 104 (e.g., stack die controller), which can provide the control signals to dictate operation of the AND gate/clock gater 426. The controller 104 and/or other components of the computing device 101 can generate a stack die activity prediction that indicates whether a particular stack die should receive a clock signal or not. For example, if the stack die activity prediction indicates that the stack die 130 will be idle at a particular time, the stack die activity prediction line 424 can be provided with a clock disable signal (e.g., logic 0), which can cause the AND gate 426 to prevent the clock signal from passing to the components of stack die 130. If, however, the stack die activity prediction indicates that the stack die 130 is to be operative and not idle (or low power) at a particular time (e.g., to perform an operation), the stack die activity prediction line 424 can be provided with a clock enable signal (e.g., logic 1), which can cause the AND gate 426 to pass the clock signal through the AND gate 426 and to the select clock line 428 of the clock distribution tree 202 (e.g., stack die clock distribution tree or stack die clock tree) so that the clock signal is provided to the components 132 in the clock tree 202 so that the components are synchronized and/or powered on. In certain implementations, the clock disable or enable signal resulting from the stack die activity prediction can be provided as a control signal from the controller 104, for example.

Figure 6:
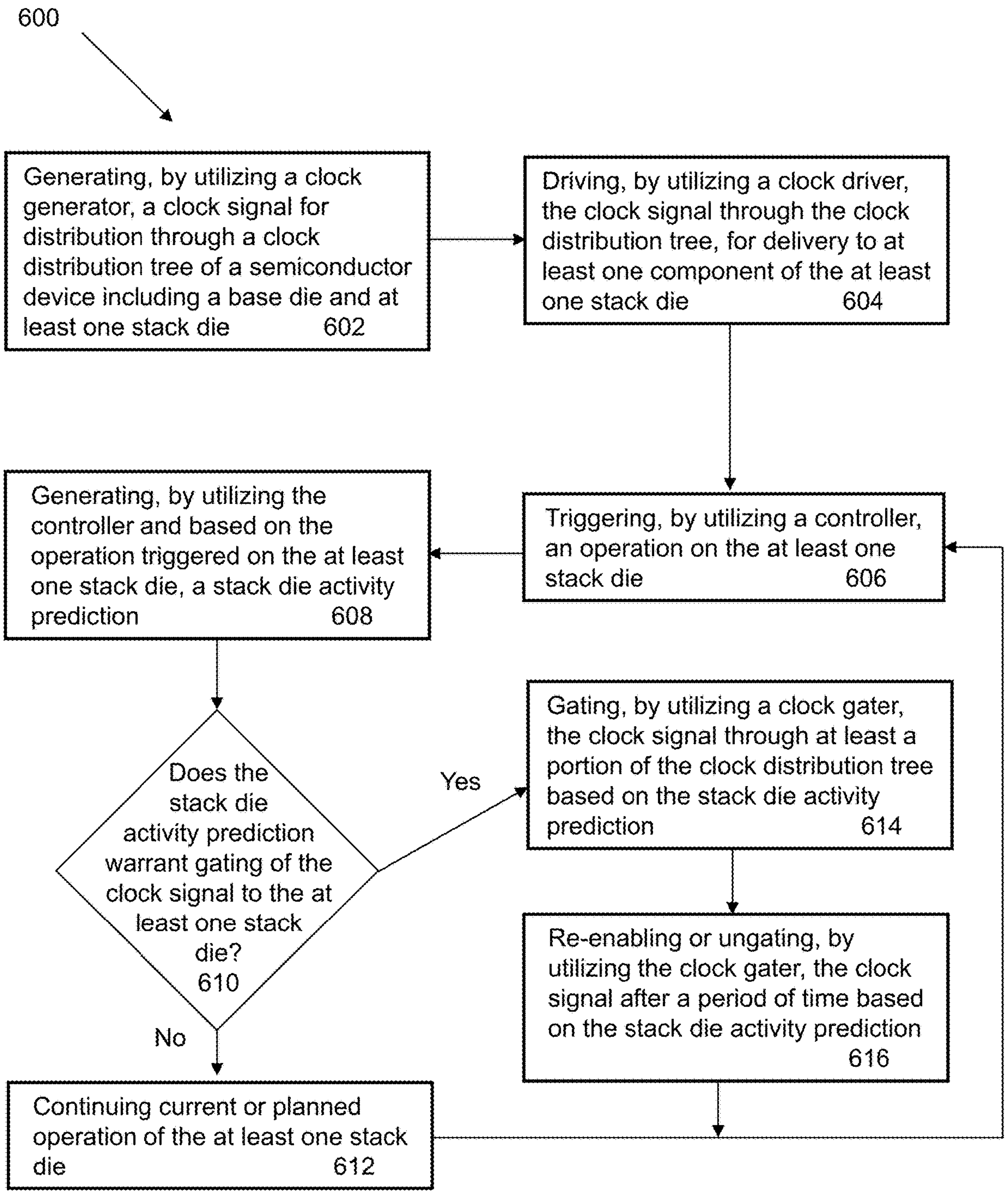
FIG. 6 is a flow diagram of an exemplary method for providing clock distribution gating according to implementations of the present disclosure.

FIG. 6 is a flow diagram of an exemplary method 400 for providing clock distribution gating, such as for a semiconductor device including base die, stack die, or a combination thereof. The steps shown in FIG. 6 can be performed by any suitable circuit and/or system, including the system(s) illustrated in FIGS. 1, 2, 3, 4 and/or 5. In certain implementations, each of the steps shown in FIG. 6 represent an algorithm whose structure includes and/or is represented by multiple sub-steps, examples of which will be provided in greater detail below. In certain implementations, each of the steps shown in FIG. 6 can represent actions, activities, processes, and/or operations that can be performed by the components of FIGS. 1, 2, 3, 4, and 5. The method 600 can be adapted and/or modified to be utilized with any of the systems of FIGS. 1, 2, 3, 4, and 5.

As illustrated in FIG. 6 and in certain implementations, at step 602, one or more of the systems described herein can generate a clock signal for distribution through a clock distribution tree of a semiconductor device. For example, the controller 104 of the base die 102 can transmit one or more signals to cause a clock generator (e.g., clock generator 302) to generate the clock signal for distribution the clock distribution tree of the semiconductor device. In certain implementations, for example, the clock generator can be a clock source, such as, but not limited to an oscillator, a phase-locked loop (PLL), a crystal oscillator, clock generator, and/or other type of clock source. In certain implementations, the clock signal can be transmitted up and down the semiconductor package 150 via interconnect components, such as through-silicon vias 109. For example, the clock signal can be transmitted from the base die 102 to one or more of the stack die 120, 130, 140. In certain implementations, the controller 104 of the base die 102 can receive instructions from an external device 160 and/or components of the system 100 to activate the clock generator to generate the clock signal for distribution through a clock distribution tree of the semiconductor device. In certain implementations, the clock signal can be generated by the clock generator upon activation or powering on of the semiconductor device.

At step 604, the method 400 can include, in certain implementations, driving, by utilizing a clock driver, the clock signal through the clock distribution tree for delivery to one or more components of the semiconductor device. For example, the clock signal can be driven through the clock distribution tree to one or more of the stack die of the stack of the semiconductor package by one or more clock drivers (e.g., clock driver 206, clock drivers **306*a*, 306*b*). In certain implementations, the driving of the clock signal can be conducted by utilizing one or more of the components described in the present disclosure and/or Figures. In certain implementations, for example, the controller 104** can generate a control signal and provide the control signal to the clock driver(s) to cause the clock driver(s) to distribute the clock signal through the clock distribution tree. For example, in certain implementations, the clock signal can be driven through the clock distribution tree to synchronize operations across different parts of the circuitry of the semiconductor device. In certain implementations, the clock signal can be utilized for control of sequential logic, defining when data can move between and/or among components of the semiconductor device, facilitate timing control of states in a system including the semiconductor device, and/or for other purposes.

At step 606, the method 600 can include triggering an operation on the one or more stack die of the semiconductor device. For example, in certain implementations, the controller can trigger the operation one the one or more stack die of the semiconductor device. As an example, the controller can trigger an operation on the one or more stack die, such as a tag lookup, which can be utilized to identify or locate data in a cache, memory, and/or other storage component based on a unique identifier (e.g., a tag). Characteristics associated with the triggered operation can be monitored, analyzed, and/or stored. For example, characteristics, such as, but not limited to, the amount of cycles to complete the operation, the amount of power required to perform the operation (e.g., power consumption), speed of completion of the operation, any delays in conducting the operation, the temperature of the components in the stack die (and/or base die), the instructions per cycle, the load on the components of the stack die (and/or base die), the time it takes to access the data from the cache/memory, whether registers have been accessed and which registers have been accessed, sensor data associated with the performance of the operation (e.g., sensor data, such as, but not limited to, humidity, temperature, pressure, light, vibration, tactile, acceleration, location data (e.g., where in the device is the operation being performed and by what components), sound, magnetic field data, detected chemical and/or gas data, motion, etc.) any other metrics and/or characteristics, or a combination thereof.

At step 608, the method 600 can include generating, such as by utilizing the controller and based on the operation triggered on the one or more stack die, a stack die activity prediction. In certain implementations, the stack die activity prediction can be a prediction identifying, indicating, and/or forecasting which components (e.g., circuits, memories, caches, etc.) of the one or more stack die are utilized for a particular type of operation (e.g., a tag look up or other type of operation). For example, if the tag lookup operation took ten cycles to complete, the controller (and/or other components of the system 100) can predict that another tag lookup operation or another operation having a threshold correlation or similarity to the tag lookup operation would be predicted or expected to utilize the same components of the semiconductor package (e.g., certain stack die or stack die components within each stack die) for a particular duration and with the same or similar amount of computing resources. In certain implementations, the stack die activity prediction can also be generated based on the controller and/or other components of the system 100 monitoring and analyzing the operations that are executed by the base die, the stack die, or a combination thereof, over a period of time. For example, the controller can determine that during certain times there are a certain number and/or type of operations that are conducted during a certain time range during the day and there are certain time ranges during the day where there are no operations or relatively few operations. Such information can be utilized to predict the stack die activity for one or more of the stack die (and/or base die activity) in the semiconductor device. In certain implementations, the monitoring can be facilitated by the components of the stack die and/or base die providing signals containing information for the operation being executed (e.g., cycles used, components, used, computing resources used, etc.).

In certain implementations, to facilitate the generation, confirmation, and/or supplementation of the prediction, the signals and/or information obtained via the monitoring can be provided to a machine learning system or artificial intelligence system for analysis. In certain implementations, for example, a machine learning model fed the information can identify patterns associated with the processing of the operation, predict which components of the stack die and/or base die will be used the next time the same or similar (e.g., threshold level of similarity) operation is executed using the semiconductor device, predict how long the components will be utilized to perform the operation, predict the types of operations that will be executed by the die of the semiconductor device (e.g., such as during a specific time period), predict whether one or more components of the stack die and/or base die will be idle during a period of time and/or have a threshold low level of use of computing resources associated with execution of the operation, any other predictions, or a combination thereof.

Once the stack die activity prediction (and/or base die activity prediction) is made, the method 600 can proceed to step 610. At step 610, the method 600 can include determine whether the stack die activity prediction (or base die prediction) warrants gating of the clock signal to one or more of the stack die. For example, if the trigger operation is a tag lookup and stack die 140 was not utilized (e.g., idle state) during the performance of the trigger operation, the next time a tag lookup operation or similar operation (e.g., an operation having a threshold similarity in terms of type of operation, data to be processed and/or obtained, etc.) is requested to be performed, the stack die activity prediction can indicate that that stack die 140 has a low or zero likelihood of being utilized during performance of the requested operation. As another example, if the trigger operation is a tag lookup operation and all the stack die in the stack of the semiconductor device are utilized to perform the operation, the stack die activity prediction can indicate that all of the stack die are to be utilized the next time the same or similar operation is requested to be performed.

At step 610, if the stack die activity prediction indicates that gating of the clock signal to one or more stack die (or even to individual components on each stack die) is not warranted or needed, the method 600 can proceed to step 612. At step 612, the method 600 can include continuing current or planned operation of the at least one stack die of the semiconductor device. In certain implementations, at step 612, the clock signaling can continue to be distributed through the clock distribution tree of the semiconductor device in the current manner and/or in a planned manner. In certain implementations, if the stack die activity prediction indicates that gating of the clock signal to one or more s tack die is warranted or needed, the method 600 can proceed to step 614. At step 614, the method 600 can include gating, such as by utilizing one or more clock gaters, the clock signal through at least a portion of the clock distribution tree based on the stack die activity prediction. For example, if the stack die activity prediction indicates that stack die 120 and 130 should continue to receive the clock signal to perform a particular operation since those stack die are expected to be utilized in performing the operation, the clock signal can be allowed to proceed to those stack die 120, 130 via the clock gater(s). However, if the stack die activity prediction indicates that stack die 140 will be idle and/or is not necessary for performance of the operation, one or more clock gater(s) can be instructed to gate the clock signal through the clock distribution tree containing the stack die 140 (i.e., prevent the clock signal from going through the portion of the clock distribution tree containing the stack die 140), while still allowing the click signal to be distributed through the remaining portions of the clock distribution tree containing stack die 120 and 130.

At step 616, the method 600 can include re-enabling or ungating the clock signal by utilizing the clock gater, such as after a period of time, based on the stack die activity prediction. For example, if the stack die activity prediction indicates that a particular operation (or activity) to be performed by the stack die will end after a certain amount of cycles (e.g., clock cycles or processing cycles) or that a new operation requiring stack die 140, for example, will need all of the stack die of the semiconductor device to receive the clock signal, the controller can generate a control signal to re-enable and/or ungate the clock signal. For example, the controller can transmit the control signal to the clock gater (s), which can, based on the control signal, ungate or re-enable the clock signal to enable the clock signal to pass through the portion of the clock distribution tree that was previously gated. Whether the method 600 is at step 612 or step 616, the method 600 can then proceed to step 606 to trigger new operations and/or to generate new stack die activity predictions and then proceed through the method 600. In certain implementations, the method 600 can incorporate any of the functionality as described in the present disclosure and can be amplified and/or modified accordingly.

Based on at least the foregoing and as detailed herein, the systems and methods provide a mechanism for effective clock distribution gating, such as based on stack die activity predictions generated by the systems and methods of the present disclosure. By default, a clock generator can generate a clock signal for distribution or propagation through a clock distribution tree connected to the various components of a semiconductor device, such as a 3D integrated circuit device including a base die and any number of stack die. In order to determine whether to gate the clock signal from certain portions of the clock distribution tree, the systems and methods generate stack die activity predictions to help determine how to prune (i.e., gate) certain portions of the clock distribution tree. For example, the systems and methods can trigger an operation for execution on the semiconductor device including the base die and stack die.

Based information obtained based on execution of the instruction (e.g., cycles used, sensor data, time for conducting the operation, which components were used to perform the operation, etc.), the systems and methods can predict the stack die activity for one or more of the stack die in the semiconductor device. For example, if certain stack die are not utilized and/or are idle during execution of the operation, the systems and methods can predict that a next operation that is the same as the executed operation or is a similar operation will have the same or similar stack die activity. Based on the predicted stack die activity, the systems and methods can instruct the clock gaters of the semiconductor device to gate the clock signal from propagating through various portions of the clock distribution tree, such as to reduce power consumption. At a certain point in time, such as when another operation is requested that requires activation of additional stack die and/or components within a stack die, the clock gaters can be instructed to re-enable or ungate the clock signal so that the clock signal can propagate across the entirety (or a different portion) of the clock distribution tree so that the additional stack die and/or components within a stack die are operational and utilized for performing the other operation.

In certain implementations, the systems and methods can support stack heights of various sizes and can support semiconductor packages with any number of stack die. In certain implementations, the stack die and the base die can utilize the same technology or be implemented in separate types of technologies. In certain implementations, certain features and functionality of the systems and methods can be inspected and/or analyzed via the stack die and/or base die connectivity, such as via interconnects. Such interconnects can be implemented by utilizing through-silicon vias and/or other types of interconnects, as described in the present disclosure. In certain implementations, certain features and functionality provided by the systems and methods can be inspected and/or analyzed via firmware registers and/or fuses, which, for example, can be aligned to the sensor configuration for the sensors on the stack die and/or base die.

Accordingly, the systems and methods described herein enable improved and more effective techniques for conducting clock distributing gating, such as on a 3D integrated circuit semiconductor device including base die and any number of stack die stacked onto the base die. By effectively predicting stack die activity and gating clock signals to certain parts of the clock distribution tree based on such predictions, the functionality and features of the present disclosure serve to prolong the life of the semiconductor components of a semiconductor device by effectively saving computing resources from being used on components that may not need to be operational at a given time, reducing wear and tear on components that do not need to be utilized during a certain period of time, saving operating (e.g., power) costs, and providing a variety of other benefits. Because traditional propagation of clock signaling throughout the entire clock distribution tree, including through components that are idle or are not used, can reduce the life of components of semiconductor devices and utilize unnecessary power, the systems and methods provided herein overcome such problems and enable effective clock gating techniques that reduce power consumption, while intelligently pruning (i.e., gating the clock signal) the clock distribution tree based on stack die activity predictions, conditions affecting the semiconductor device (e.g., conditions affecting the base die and/or stack die), sensor data, other factors, or a combination thereof.

As detailed above, the circuits, devices, and systems described and/or illustrated herein broadly represent any type or form of computing device or system capable of executing computer-readable instructions, such as those contained within the modules described herein. In their most basic configuration, these computing device(s) each include at least one memory device and at least one physical processor.

In some examples, the term "memory device" generally refers to any type or form of volatile or non-volatile storage device or medium capable of storing data and/or computer-readable instructions. In one example, a memory device stores, loads, and/or maintains one or more of the modules and/or circuits described herein. Examples of memory devices include, without limitation, Random Access Memory (RAM), Read Only Memory (ROM), flash memory, Hard Disk Drives (HDDs), Solid-State Drives (SSDs), optical disk drives, caches, variations, or combinations of one or more of the same, or any other suitable storage memory.

In some examples, the term "physical processor" generally refers to any type or form of hardware-implemented processing unit capable of interpreting and/or executing computer-readable instructions. In one example, a physical processor accesses and/or modifies one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), systems on a chip (SoCs), digital signal processors (DSPs), Neural Network Engines (NNEs), accelerators, graphics processing units (GPUs), portions of one or more of the same, variations or combinations of one or more of the same, or any other suitable physical processor.

In some implementations, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein are shown or discussed in a particular order, these steps do not necessarily need to be performed in the order illustrated or discussed. The various exemplary methods described and/or illustrated herein can also omit one or more of the steps described or illustrated herein or include additional steps in addition to those disclosed.

The preceding description has been provided to enable others skilled in the art to best utilize various aspects of the exemplary implementations disclosed herein. This exemplary description is not intended to be exhaustive or to be limited to any precise form disclosed. Many modifications and variations are possible without departing from the spirit and scope of the present disclosure. The implementations disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device, comprising:
- a plurality of stack dies disposed in a vertical stack; and
- a first die of the plurality of stack dies comprising:
  - a clock driver configured to:
    - drive a clock signal through a clock distribution tree for delivery to at least one component of at least one stack die of the plurality of stack dies;
  - a controller configured to:
    - trigger a first operation on the at least one stack die; and
    - generate a stack die activity prediction based on the first operation triggered on the at least one stack die; and
  - a clock gater configured to:
    - gate the clock signal through at least a portion of the clock distribution tree based on the stack die activity prediction.

2. The device of claim 1, wherein the first die further comprises a clock generator configured to:
- generate the clock signal; and
- provide the clock signal to the clock driver to drive the clock signal through the clock distribution tree for delivery to the at least one component of the at least one stack die.

3. The device of claim 1, wherein the clock gater is further configured to:
- gate the clock signal through at least the portion of the clock distribution tree based on sensor data from at least one sensor of the device.

4. The device of claim 1, wherein the controller is further configured to:
- generate the stack die activity prediction based on a type of the first operation triggered on the at least one stack die.

5. The device of claim 1, wherein the controller is further configured to:
- trigger a second operation on the at least one stack die;
- generate a second stack die activity prediction based on the second operation triggered on the at least one stack die; and
- gate the clock signal through the clock distribution tree in accordance with the second stack die activity prediction.

6. The device of claim 1, wherein the controller is further configured to:
- gate the clock signal through at least the portion of the clock distribution tree based on the stack die activity prediction providing an indication that the at least one component will be in an idle state.

7. The device of claim 1, wherein the controller is further configured to:
- gate the clock signal through at least the portion of the clock distribution tree based on a performance associated with the at least one stack die, the at least one component, the first die, or a combination thereof.

8. The device of claim 1, wherein the controller is further configured to:
- generate a control signal to re-enable or ungate the clock signal through at least the portion of the clock distribution tree; and
- provide the control signal to the clock gater.

9. The device of claim 8, wherein the clock gater is further configured to:
- ungate or re-enable, based on the control signal, the clock signal through at least the portion of the clock distribution tree.

10. The device of claim 1, wherein controller is further configured to:
- generate, based on the stack die activity prediction, a performance of the device, sensor data, or a combination thereof, a control signal to gate the clock signal through at least the portion of the clock distribution tree; and
- provide the control signal to the clock gater.

11. The device of claim 10, wherein the clock gater is further configured to:
- gate, based on the control signal, the clock signal through at least the portion of the clock distribution tree.

12. The device of claim 1, wherein the controller is further configured to:
- receive an instruction from an external device to perform a second operation; and
- determine that the second operation has a correlation with the stack die activity prediction.

13. The device of claim 1, wherein the controller is further configured to:
- generate a control signal to gate the clock signal through at least the portion of the clock distribution tree; and
- provide the control signal to the clock gater to gate the clock signal.

14. A system comprising:

a memory; and a device communicatively linked to the memory, and comprising:

at least one stack die; and a base die disposed in a vertical stack with the at least one stack die and comprising:

a clock driver configured to:

drive a clock signal through a clock distribution tree for delivery to at least one component of the at least one stack die;

a controller configured to:

trigger, based on instructions from the memory, a first operation on the at least one stack die; and generate, based on the instructions from the memory, a stack die activity prediction based on the first operation triggered on the at least one stack die; and a clock gater configured to:

gate the clock signal through at least a portion of the clock distribution tree based on the stack die activity prediction.

15. The system of claim 14, wherein the controller is further configured to identify a component of the at least one component for which the clock signal is to be gated by the clock gater.

16. The system of claim 14, wherein the at least one stack die further comprises:

a stack die clock driver configured to:

drive a stack die clock signal through a stack die clock distribution tree for delivery to the at least one component of the at least one stack die.

17. The system of claim 16, wherein the at least one stack die further comprises:

a stack die controller configured to:

trigger, based on instructions from the memory, a second operation on the at least one stack die; and generate, based on the instructions from the memory, a different stack die activity prediction based on the second operation triggered on the at least one stack die.

18. The system of claim 17, wherein the at least one stack die further comprises:

a stack die clock gater configured to gate the stack die clock signal through the stack die clock distribution tree based on the different stack die activity prediction.

19. A method, comprising:

driving, by utilizing a clock driver, a clock signal through a clock distribution tree for delivery to at least one component of at least one stack die;

triggering, by utilizing a controller of a semiconductor device comprising a vertical stack including a base die and the at least one stack die, a first operation on the at least one stack die;

generating, by utilizing the controller, a stack die activity prediction based on a type of the first operation triggered on the at least one stack die; and gating, by utilizing a clock gater, the clock signal through at least a portion of the clock distribution tree based on the stack die activity prediction.

20. The method of claim 19, further comprising ungating the clock signal based on a control signal generated by the controller, based on the stack die activity prediction, or a combination thereof.

* * * * *